(12) United States Patent
Chang et al.

(10) Patent No.: US 10,137,752 B2
(45) Date of Patent: Nov. 27, 2018

(54) POWER HEAT DISSIPATION DEVICE

(71) Applicant: INDUSTRIAL TECHNOLOGY RESEARCH INSTITUTE, Hsinchu (TW)

(72) Inventors: Po-Hua Chang, Nantou County (TW); Min-Chuan Wu, Taipei (TW); Wen-Shu Chiang, Hsinchu (TW); Li-Song Lin, Nantou (TW); Kou-Tzeng Lin, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/981,118

(22) Filed: Dec. 28, 2015

(65) Prior Publication Data

US 2017/0120719 A1  May 4, 2017

(30) Foreign Application Priority Data

Oct. 30, 2015 (TW) .............................. 104135776 A

(51) Int. Cl.
*B60H 1/00* (2006.01)
*H01L 23/38* (2006.01)

(52) U.S. Cl.
CPC ..... *B60H 1/00321* (2013.01); *B60H 1/00392* (2013.01); *H01L 23/38* (2013.01)

(58) Field of Classification Search
CPC . H01L 23/38; H01L 2023/4043; H01L 23/34; H01L 23/467; F25B 2321/0251;
(Continued)

(56) References Cited

U.S. PATENT DOCUMENTS 2,777,975 A * 1/1957 Aigrain ................... H01L 23/38
                                                                136/203
5,456,081 A * 10/1995 Chrysler ................. H01L 23/38
                                                                136/204
(Continued)

FOREIGN PATENT DOCUMENTS

CN        201894040 U     7/2011
TW         I251461 B      3/2006
(Continued)

OTHER PUBLICATIONS

Sullivan et al., Array of Thermoelectric Coolers for On-Chip Thermal Management, Journal of Electronic Pachaging, Jun. 2012, vol. 134, pp. 021005-1-021005-8.
(Continued)

*Primary Examiner* — Orlando E Aviles Bosques
*Assistant Examiner* — Jose O Class-Quinones
(74) *Attorney, Agent, or Firm* — Rabin & Berdo, P.C.

(57) ABSTRACT

A power heat dissipation device includes a heat-conducting layer, a heat sink and at least one cooling chip. The heat-conducting layer has a heat-absorbing surface and a heat-dissipating surface. The heat sink is in thermal contact with the heat-dissipating surface, and a heat-conducting section is formed in the heat sink. The cooling chip is embedded in the heat sink and disposed adjacent to the heat transferring channel. The cooling chip has a cooling surface which is perpendicular to the heat-absorbing surface. The cooling surface faces the heat transferring channel. The cooling chip removes heat from the heat-conducting section in the heat sink.

20 Claims, 5 Drawing Sheets

(58) Field of Classification Search
CPC ............ F25B 2321/025; F25B 2321/02; F25B 2321/023; F28D 2021/0028; F28D 2021/0029
See application file for complete search history.

(56) References Cited

U.S. PATENT DOCUMENTS

| | | | |
|---|---|---|---|
| 5,877,552 | A | 3/1999 | Chiang |
| 5,895,973 | A * | 4/1999 | Fessenden .............. H01L 24/28 257/675 |
| 7,313,921 | B2 | 1/2008 | Milke-Rojo et al. |
| 7,523,617 | B2 | 4/2009 | Venkatasubramanian et al. |
| 7,843,694 | B2 | 11/2010 | Liang et al. |
| 8,621,875 | B2 | 1/2014 | Parish et al. |
| 2005/0213301 | A1 | 9/2005 | Prasher |
| 2012/0057300 | A1* | 3/2012 | Tan .......................... H01L 23/38 361/697 |
| 2013/0091866 | A1 | 4/2013 | Campbell et al. |
| 2013/0168798 | A1 | 7/2013 | Chang et al. |
| 2014/0216058 | A1* | 8/2014 | Tsuboi ...................... G06F 1/20 62/3.2 |

FOREIGN PATENT DOCUMENTS

| | | |
|---|---|---|
| TW | I316120 B | 10/2009 |
| TW | I327888 B | 7/2010 |
| TW | 201212802 A | 3/2012 |
| TW | 201223426 A | 6/2012 |
| TW | 201250120 A | 12/2012 |
| TW | I461635 B | 11/2014 |

OTHER PUBLICATIONS

Alexandrov et al., Control Principles and On-Chip Circuits for Active Cooling Using Integrated Super Lattice Based Thin-Film Thermoelectric Devices, IEEE, 2013, pp. 1-11.
Redmond et al., Hotspot Cooling in Stacked Chips Using Thermoelectric Coolers, IEEE Transactions on Components, Packaging and Manufacturing Technology, vol. 3, No. 5, May 2013, pp. 759-767.
Wang et al., Hybrid Solid- and Liquid-Cooling Solution for Isothermalization of Insulated Gate Bipolar Transistor Power Electronic Devices, IEEE Transactions on Components, Packaging and Manufacturing Technology, vol. 3, No. 4, Apr. 2013, pp. 601-611.
Semenyuk, Miniature Thermoelectric Modules With Increased Cooling Power, 2006 International Conference on Thermoelectric, pp. 322-326.
Owoyele et al., Performance Analysis of a Thermoelectric Cooler With a Corrugated Architecture, Applied Energy, 147(2015), pp. 184-191.
Sullivan et al.,, Thermoelectric Coolers for Thermal Gradient Management on Chip, Abstract.
Narasimhan et al., Thin Film Thermoelectric Cooler Thermal Validation and Product Thermal Performance Estimation, 2006 IEEE, pp. 470-475.
Taiwan Patent Office, Office Action dated Jun. 23, 2016.
Taiwan Patent Office, Office Action dated May 8, 2018.

* cited by examiner

POWER HEAT DISSIPATION DEVICE

CROSS-REFERENCE TO RELATED APPLICATIONS

This non-provisional application claims priority under 35 U.S.C. § 119(a) on Patent Application No(s). 104135776 filed in Taiwan, R.O.C. on Oct. 30, 2015, the entire contents of which are hereby incorporated by reference.

TECHNICAL FIELD

The disclosure relates to a power heat dissipation device.

BACKGROUND

With the development of technology, the power system for the electric vehicles (EV) is designed to be smaller, for being fitted in various types of electric vehicles. In addition, the power system has been developed to be more powerful; for example, the power electronic unit (PEU) in the power system is equipped with more power devices (e.g. transistor) or higher performance power devices. Hence, a heat dissipation system is adopted to dissipate heat generated by the power devices. An ideal heat dissipation device should dissipate the heat generated by the power device timely no matter the power device is at the rated output or the peak output. In such a case, the ideal dissipation device is designed large in size in order to timely dissipate the heat generated by the power device at the peak output.

SUMMARY

One embodiment of the disclosure provides a power heat dissipation device, which includes a heat-conducting layer, a heat sink and at least one cooling chip. The heat-conducting layer has a heat-absorbing surface and a heat-dissipating surface. The heat sink is in thermal contact with the heat-dissipating surface of the heat-conducting layer and a heat-conducting section is formed in the heat sink. The cooling chip is embedded in the heat sink and adjacent to the heat transferring channel. The cooling chip has a cooling surface. The cooling surface of the cooling chip is perpendicular to the heat-absorbing surface of the heat-conducting layer and faces the heat-conducting section in the heat sink. The cooling chip removes heat form the heat-conducting section in the heat sink.

BRIEF DESCRIPTION OF THE DRAWINGS

The present invention will become better understood from the detailed description given hereinbelow and the accompanying drawings which are given by way of illustration only and thus are not limitative of the present invention and wherein.

DETAILED DESCRIPTION

Figure 1:
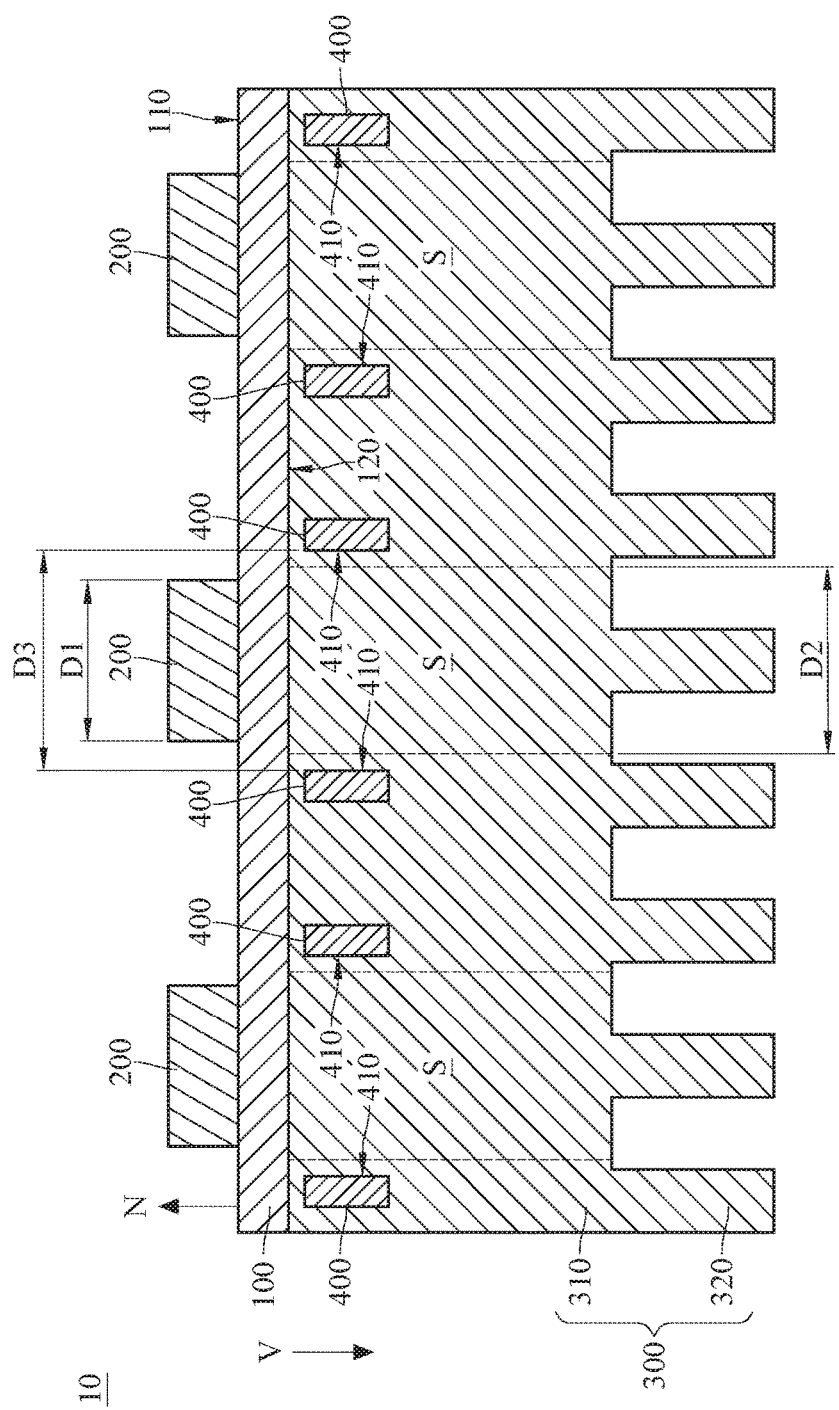
FIG. 1 is a cross-sectional view of a power heat dissipation device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a cross-sectional view of a power heat dissipation device according to a first embodiment of the present disclosure.

This embodiment provides a power heat dissipation device 10, which includes a heat-conducting layer 100, a heat sink 300 and a plurality of cooling chips 400. The power heat dissipation device 10 is configured to remove heat generated by the power devices 200 disposed on the heat-conducting layer 100 so that the temperature of the power device 200 can be reduced. The power device 200 is, for example, a transistor, which has a safe operating temperature.

The heat-conducting layer 100 is, for example, an Aluminum plate. The heat-conducting layer 100 has a heat-absorbing surface 110 and a heat-dissipating surface 120 which are opposite to each other.

The power devices 200 are stacked on the heat-absorbing surface 110 of the heat-conducting layer 100. When the working temperature of the power device 200 is below the safe operating temperature, the power device 200 provides better performance. When the working temperature of the power device 200 exceeds the safe operating temperature, the performance of the power device 200 is decreased, or the power device 200 even be shut down or burn out. Thus, developers set a threshold temperature which is about 80% of the safe operating temperature. When the working temperature exceeds the threshold temperature, an active heat dissipating system, e.g. the cooling chip 400 which will be described hereinafter, is in operation.

The heat sink 300 is, for example, a cooling fin. The heat sink 300 is in thermal contact with the heat-dissipating surface 120 of the heat-conducting layer 100. In detail, the heat sink 300 includes a base portion 310 and a plurality of fin-shaped portions 320. One end of the base portion 310 is in thermal contact with the heat-dissipating surface 120 of the heat-conducting layer 100. The fin-shaped portions 320 protrude from the other end of the base portion 310. When the power device 200 is in operation, heat generated by the power device 200 is able to be transferred to the heat sink 300 through the heat-conducting layer 100, thereby forming a heat-conducting section S. The so called heat-conducting section S is a channel in the heat sink 300 and beneath the power device 200. When a width of a heat-dissipating surface of the power device 200 is equal to a width of the power device 200, a width D2 of the heat-conducting section S is about 110% to about 120% of a width D1 of the power device 200. In general, the width D2 of the heat-conducting section S is greater than the width D1 of the power device 200.

The cooling chips 400 are embedded in the base portion 310 of the heat sink 300 and disposed around the heat transferring channels S. In detail, in this embodiment, each power device 200 is equipped with two cooling chips 400, and the two cooling chips 400 are disposed on two opposite sides of the heat-conducting section S. Furthermore, each cooling chip 400 has a cooling surface 410. The cooling surface 410 of the cooling chip 400 is perpendicular to the heat-dissipating surface 120 of the heat-conducting layer 100 and faces the heat-conducting section S in the base portion 310 of the heat sink 300, allowing the cooling chips 400 in operation to remove heat from the heat-conducting section S.

In this embodiment, since the cooling chips 400 are disposed in the heat sink 300 but disposed in the heat-conducting layer 100, the thickness of the heat-conducting layer 100 is able to be reduced. In such a case, the heat sink 300, which has relative large size than the heat-conducting layer 100, is able to accommodate more cooling chips 400 or larger size cooling chips 400, thereby enhancing the heat dissipation capability of the power heat dissipation device 10.

In addition, an orthogonal projection of the vertically placed cooling chip 400 on the heat-dissipating surface 120 is smaller than an orthogonal projection of the horizontally placed cooling chip; thus, whether or not the vertically placed cooling chip 400 is in operation, the heat transfer paths blocked by the vertically placed cooling chip is reduced.

Moreover, a distance D3 between two of the cooling surfaces 410 which are adjacent to one of the power devices 200 is greater than the width D1 of the power device 200.

Therefore, a situation that heat generated by the two cooling chips 400 is transferred back to the power device 200 is prevented.

In this embodiment, the two cooling surfaces 410 are spaced apart from the heat-conducting section S located therebetween. In details, the distance D3 between two of the cooling surfaces 410 is greater than the width D2 of the heat-conducting section S located therebetween, but the present disclosure is not limited thereto. In other embodiments, the two cooling surfaces 410 are attached to the heat-conducting section S located therebetween; that is, the two cooling surfaces 410 are directly connected to the heat-conducting section S, which improves the heat dissipation capability of the cooling chips 400 with respect to the power device 100.

Figure 2:
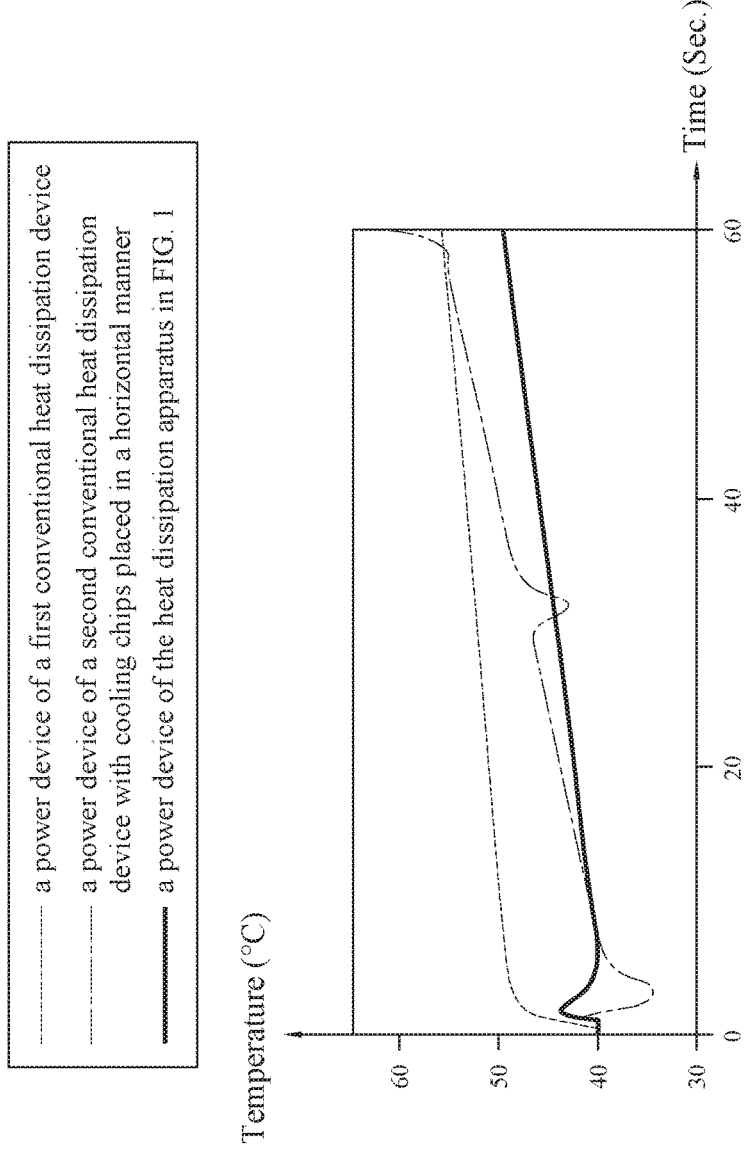
FIG. 2 is a temperature-time plot showing when a power device of a first conventional heat dissipation device, a power device of a second conventional heat dissipation device with cooling chips placed in a horizontal manner and a power device of the power heat dissipation device in FIG. 1 are in operation.

Please refer to FIG. 2, which is a temperature-time plot showing when a power device of a first conventional heat dissipation device, a power device of a second conventional heat dissipation device with cooling chips placed in a horizontal manner and a power device of the power heat dissipation device in FIG. 1 are in operation. The first conventional heat dissipation device has no cooling chip but is simply equipped with a cooling fin. The second conventional power heat dissipation device is equipped with cooling chips, and the cooling surfaces of the cooling chips are parallel to the heat-dissipating surface of the heat-conducting layer.

As shown in FIG. 2, the second conventional power heat dissipation device is able to effectively decrease the temperature of the power device at the beginning of the 2 seconds, but after about 60 seconds, the temperature of the power device is abruptly increased because the transfer of the heat generated by the power device is blocked by the cooling chips being placed in a horizontal manner so that the performance of the power device is decreased. However, in the power heat dissipation device disclosed in this embodiment, the cooling chips 400 are placed in a vertical manner, and the transfer paths of the heat generated by the power device 200 being block by the cooling chips is reduced. Thus, whether or not the cooling chip 400 is in operation, it has less chance to block the transfer of the heat generated by the power device 200, and a significant raised temperature of the power device 200 when the cooling chip 400 is not in operation can be prevented.

Figure 3:
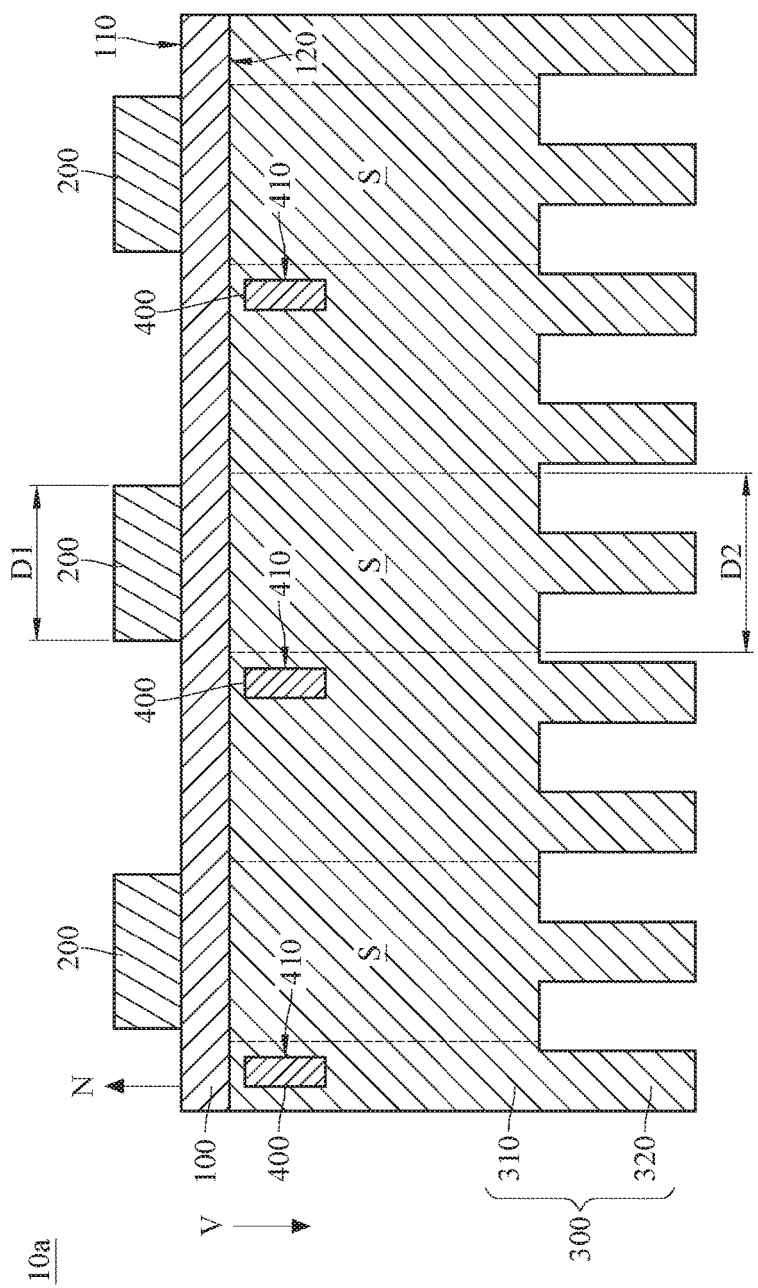
FIG. 3 is a cross-sectional view of a power heat dissipation device according to a second embodiment of the present disclosure.

In the aforementioned embodiment, each power device 200 is equipped with two cooling chips 400, but the present disclosure is not limited thereto. Please refer to FIG. 3, which is a cross-sectional view of a power heat dissipation device according to a second embodiment of the present disclosure. This embodiment provides a power heat dissipation device 10a. In this embodiment, each power device 200 is equipped with one cooling chip 400 disposed on one side of the heat-conducting section S.

Figure 4:
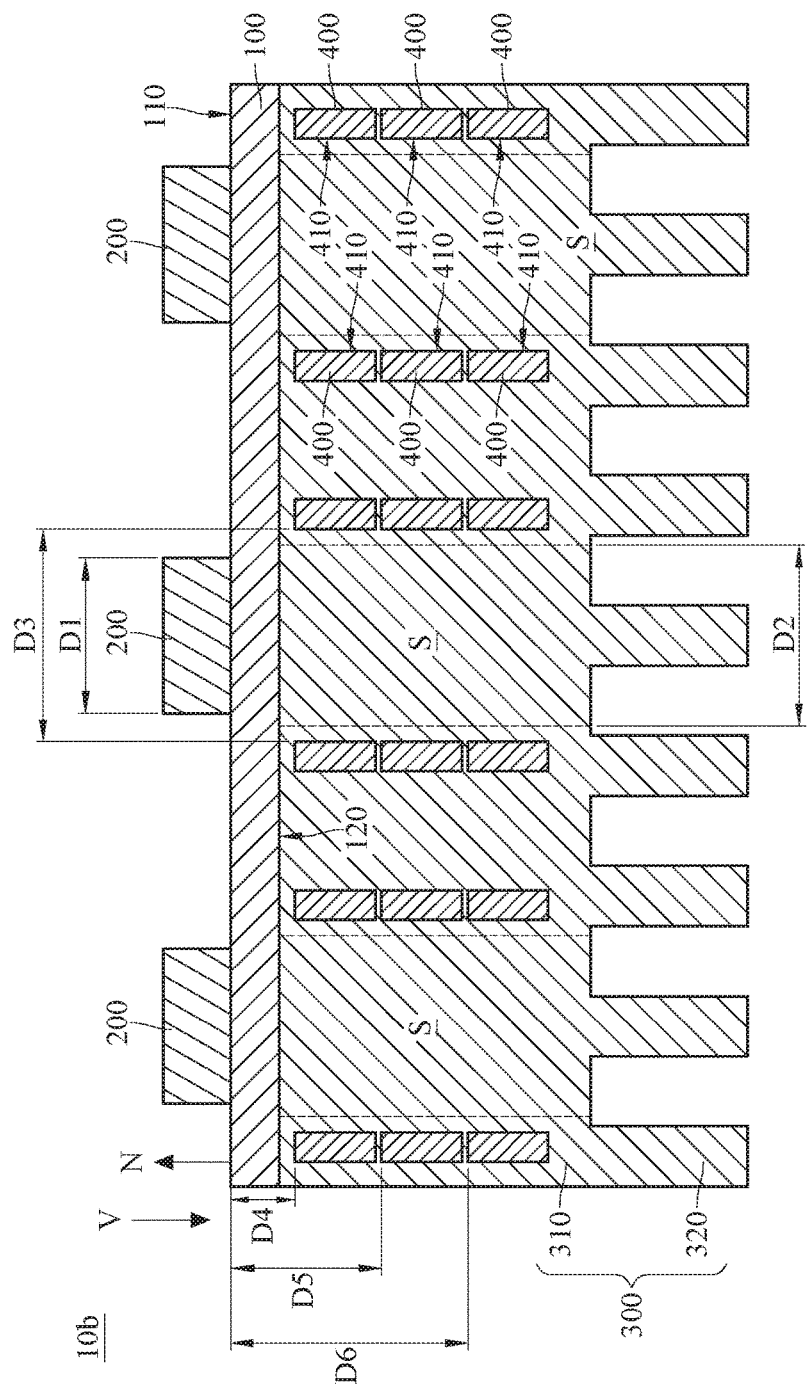
FIG. 4 is a cross-sectional view of a power heat dissipation device according to a third embodiment of the present disclosure.

In the first or the second embodiments, there has a plurality of columns of cooling chips 400 disposed in the heat sink 300, and each column has only one cooling chip 400, but the present disclosure is not limited thereto. Please refer to FIG. 4, which is a cross-sectional view of a power heat dissipation device according to a third embodiment of the present disclosure. This embodiment provides a power heat dissipation device 10b. In this embodiment, there are columns of the cooling chips 400 disposed in the heat sink 300. In detail, each of the columns has a plurality of cooling chips 400 arranged in a vertical direction V (i.e. the normal direction of the heat-absorbing surface 110). As shown in FIG. 4, each of the cooling chips 400 at top ends of the columns and the heat-absorbing surface 110 is spaced apart by a distance D4 in the vertical direction V, each of the cooling chips 400 at middle of the column and the heat-absorbing surface 110 is spaced apart by a distance D5 in the vertical direction V, and each of the cooling chips 400 at bottom ends of the columns and the heat-absorbing surface 110 is spaced a part by a distance D6 in the vertical direction V. However, the present disclosure is not limited by the quantity of the cooling chips 400 in each column. In other embodiments, there are two or over four cooling chips 400 disposed in each column.

In addition, in this embodiment, the cooling chips 400 are disposed on the two opposite sides of the heat-conducting section S, but the present disclosure is not limited thereto. In other embodiments, the cooling chip 400 is disposed on only one side of the heat-conducting section S.

In addition, in each of the columns, two of the cooling chips 400 which are next to each other are spaced apart, but the present disclosure is not limited thereto. In other embodiments, in each of the columns, two of the cooling chips 400 which are next to each other are in directly contact.

Figure 5:
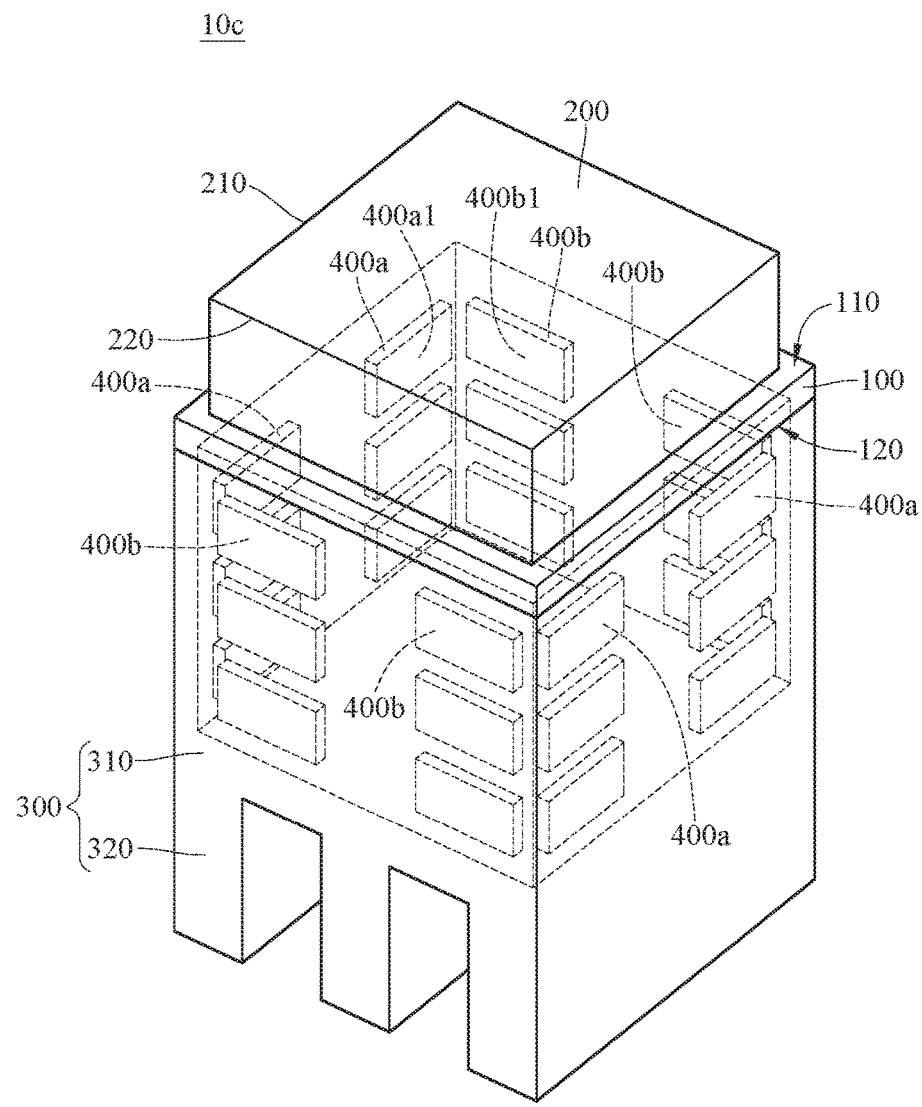
FIG. 5 is a cross-sectional view of a power heat dissipation device according to a fourth embodiment of the present disclosure.

Please refer to FIG. 5, which is a cross-sectional view of a power heat dissipation device according to a fourth embodiment of the present disclosure. This embodiment provides a power heat dissipation device 10c, which includes a heat-conducting layer 100, a heat sink 300, a plurality of first cooling chips 400a and a plurality of second cooling chips 400b. The power heat dissipation device 10c is able to remove heat generated by a power device 200, thereby reducing the temperature of the power device 200.

The heat-conducting layer 100 is, for example, an Aluminum plate. The heat-conducting layer 100 has a heat-absorbing surface 110 and a heat-dissipating surface 120 which are opposite to each other.

The power device 200 is, for example, a transistor. The power device 200 is stacked on and electrically connected to the heat-absorbing surface 110 of the heat-conducting layer 100. In addition, the power device 200 has a first edge 210 and a second edge 220 which are orthogonal to each other.

The heat sink 300 is, for example, a cooling fin. The heat sink 300 is in thermal contact with the heat-dissipating surface 120 of the heat-conducting layer 100. In detail, the heat sink 300 includes a base portion 310 and a plurality of fin-shaped portions 320. One end of the base portion 310 is in thermal contact with the heat-dissipating surface 120 of the heat-conducting layer 100. The fin-shaped portions 320 protrude from the other end of the base portion 310.

The first cooling chips 400a and the second cooling chips 400b are embedded in the base portion 310 of the heat sink 300 and disposed around the heat-conducting section S. For purpose of illustration and description, FIG. 5 simply shows the first cooling chips 400a and the second cooling chips 400b disposed on two corners of the heat sink 300, but omits the first cooling chips 400a and the second cooling chips 400b disposed on the other two corners of the heat sink 300. In this embodiment, each corner of the heat sink 300 is equipped with three first cooling chips 400a and three second cooling chips 400b. The second cooling chips 400b are perpendicular to the first cooling chips 400a, each first cooling chip 400a is parallel to the first edge 210 of the power device 200, and each second cooling chip 400b is parallel to the second edge 220 of the power device 200. In detail, second cooling surfaces 400b1 of the second cooling chips 400b are perpendicular to first cooling surfaces 400a1 of the first cooling chips 400a. Each first cooling surface 400a1 is parallel to the first edge 210 of the power device 200, and each second cooling surface 400b1 is parallel to the second edge 220 of the power device 200. In this embodiment, it is understood that one power device 200 is equipped with 24 cooling chips.

However, the present disclosure is not limited to the quantity of the first cooling chips 400a and the second cooling chips 400b disposed at each corner of the heat sink 300. In other embodiment, each corner of the heat sink 300 is equipped with two first cooling chips 400a and two second cooling chips 400b or at least four first cooling chips 400a and at least four second cooling chips 400b.

In addition, the present disclosure is not limited to that each corner of the heat sink 300 is equipped with the cooling chips. In other embodiment, the heat sink 300 has only one or two corners equipped with the cooling chips.

According to the power heat dissipation device as discussed above, the cooling chip is placed in a vertical manner, which is able to provide high heat dissipation capability, and the transfer paths of the heat generated by the power device being block by the cooling chips is reduced.

What is claimed is:

1. A power heat dissipation device, comprising:
   a heat-conducting layer having a heat-absorbing surface and a heat-dissipating surface;
   a heat sink in thermal contact with the heat-dissipating surface of the heat-conducting layer, wherein a heat-conducting section is formed in the heat sink; and
   at least one cooling chip embedded in the heat sink and disposed adjacent to the heat-conducting section, the at least one cooling chip having a cooling surface perpendicular to the heat-dissipating surface of the heat-conducting layer, and the cooling surface facing the heat-conducting section in the heat sink, such that the at least one cooling chip and the heat-conducting layer are respectively located at different sides of the heat-conduction section, enabling heat in the heat sink to be dissipated via the heat-conducting section independently of the cooling chip.

2. The power heat dissipation device according to claim 1, wherein the heat-absorbing surface of the heat-conducting layer is configured for being in thermal contact with at least one power device, a quantity of the at least one cooling chip is at least two, the at least two cooling chips are disposed on two sides of the heat-conducting section which are opposite to each other, respectively, and a distance between respective cooling surfaces of any two of the at least two cooling chips is greater than or equal to a width of the at least one power device.

3. The power heat dissipation device according to claim 1, wherein the heat absorbing surface of the heat-conducting layer is configured for being in thermal contact with at least one power device, a quantity of the at least one cooling chip is plural, the at least one power device is equipped with the plurality of the cooling chips which are arranged in a column, and vertical distances between each of the plurality of cooling chips in the column and the heat-absorbing surface are different from each other.

4. The power heat dissipation device according to claim 3, wherein two of the plurality of the cooling chips in the column which are next to each other are spaced apart.

5. The power heat dissipation device according to claim 3, wherein two of the plurality of the cooling chips in the column which are next to each other are in direct contact.

6. The power heat dissipation device according to claim 1, wherein the heat absorbing surface of the heat-conducting layer is configured for being in thermal contact with at least one power device, so that the at least one cooling chip is equipped with the at least one power device.

7. The power heat dissipation device according to claim 1, wherein the at least one cooling chip is embedded in a base portion of the heat sink.

8. The power heat dissipation device according to claim 6, wherein the at least one cooling chip is disposed vertically relative to the heat-dissipating surface of the heat-conducting layer, and the at least one cooling chip and the heat sink are disposed on a same side of the heat-conducting layer.

9. The power heat dissipation device according to claim 1, wherein the at least one cooling chip comprises a plurality of first cooling chips and a plurality of second cooling chips, the plurality of first cooling chips and the plurality of second cooling chips surround the heat conducting section, and a plurality of second cooling surfaces of the plurality of second cooling chips are perpendicular to a plurality of first cooling surfaces of the plurality of first cooling chips.

10. The power heat dissipation device according to claim 9, wherein the heat-absorbing surface of the heat-conducting layer is configured for being in thermal contact with a power device, the power device has a first edge and a second edge which are orthogonal to each other, the plurality of first cooling surfaces are parallel to the first edge, and the plurality of second cooling surfaces are parallel to the second edge.

11. The power heat dissipation device according to claim 10, wherein the plurality of first cooling chips and the plurality of second cooling chips are embedded in a base portion of the heat sink.

12. The power heat dissipation device according to claim 1, wherein the heat-conducting layer is an Aluminum plate.

13. The power heat dissipation device according to claim 1, wherein the heat sink is a cooling fin.

14. The power heat dissipation device according to claim 13, wherein the heat sink comprises a base portion and a plurality of fin-shaped portions, the base portion of the heat sink is in thermal contact with the heat-dissipating surface of the heat-conducting layer, the plurality of the fin-shaped portions protrude from the base portion, and the at least one cooling chip is embedded in the base portion.

15. The power heat dissipation device according to claim 1, wherein the heat-absorbing surface of the heat-conducting layer is configured for being in thermal contact with a power device, and a width of the heat-conducting section is greater than a width of the power device.

16. The power heat dissipation device according to claim 2, wherein a width of the heat-conducting section is 1.1 to 1.2 times greater than the width of the at least one power device.

17. The power heat dissipation device according to claim 1, wherein heat generated by a power device, which is in thermal contact with the heat-conducting layer, is removed for decreasing temperature of the power device.

18. The power heat dissipation device according to claim 1, wherein the at least one cooling chip comprises a plurality of first cooling chips and a plurality of second cooling chips, the plurality of first cooling chips and the plurality of second cooling chips are disposed beneath at least one power device and are disposed on at least one of corners of the heat sink, and a plurality of second cooling surfaces of the plurality of second cooling chips are perpendicular to a plurality of first cooling surfaces of the plurality of first cooling chips.

19. The power heat dissipation device according to claim 1, wherein the at least one cooling chip comprises a plurality of first cooling chips and a plurality of second cooling chips, the plurality of first cooling chips and the plurality of second cooling chips are disposed on four corners of the heat sink, and a plurality of second cooling surfaces of the plurality of second cooling chips are perpendicular to a plurality of first cooling surfaces of the plurality of first cooling chips.

20. The power heat dissipation device according to claim 1, wherein the heat-absorbing surface of the heat-conducting layer is configured for being in thermal contact with a power device, and the power device is a transistor.

* * * * *